(12) United States Patent
Kamo

(10) Patent No.: US 8,809,989 B2
(45) Date of Patent: Aug. 19, 2014

(54) SEMICONDUCTOR DEVICE

(71) Applicant: Yoshitaka Kamo, Tokyo (JP)

(72) Inventor: Yoshitaka Kamo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 13 days.

(21) Appl. No.: 13/845,208

(22) Filed: Mar. 18, 2013

(65) Prior Publication Data

US 2014/0008728 A1     Jan. 9, 2014

(30) Foreign Application Priority Data

Jul. 4, 2012    (JP) .................................. 2012-150414

(51) Int. Cl.
| | |
|---|---|
| *H01L 27/088* | (2006.01) |
| *H01L 27/06* | (2006.01) |
| *H01L 27/02* | (2006.01) |
| *H01L 29/417* | (2006.01) |

(52) U.S. Cl.
CPC .......... *H01L 27/088* (2013.01); *H01L 27/0605* (2013.01); *H01L 27/0207* (2013.01); *H01L 29/41758* (2013.01)
USPC ....................... 257/499; 257/368; 257/E27.06

(58) Field of Classification Search
USPC ..................................... 257/368, 499, E27.06
See application file for complete search history.

(56) References Cited

U.S. PATENT DOCUMENTS

| | | | |
|---|---|---|---|
| 6,020,613 A | * | 2/2000 | Udomoto et al. ............. 257/341 |
| 6,222,266 B1 | | 4/2001 | Kohno |
| 6,906,770 B2 | * | 6/2005 | Kim et al. ...................... 349/141 |
| 2003/0006415 A1 | * | 1/2003 | Yokogawa et al. ............. 257/77 |
| 2007/0045736 A1 | | 3/2007 | Yagishita |
| 2012/0313213 A1 | * | 12/2012 | Head et al. .................... 257/499 |

FOREIGN PATENT DOCUMENTS

| | | |
|---|---|---|
| JP | 11-103051 A | 4/1999 |
| JP | 2004-327766 A | 11/2004 |
| JP | 2007-35957 A | 2/2007 |

\* cited by examiner

*Primary Examiner* — Zandra Smith
*Assistant Examiner* — Damian A Hillman
(74) *Attorney, Agent, or Firm* — Leydig, Voit & Mayer, Ltd.

(57) ABSTRACT

A semiconductor device includes: a semiconductor substrate having a hexagonal crystalline structure with a c-axis and c-planes; and transistors on a c plane of the semiconductor substrate. Source electrodes of the transistors are connected to each other. Drain electrodes of the transistors are connected to each other. Gate electrodes of the transistors are connected to each other. The gate electrodes of the transistors extend along directions that form angles with each other that are 60 degrees or 120 degrees, in a plan view seen from a direction perpendicular to the c plane of the semiconductor substrate.

4 Claims, 2 Drawing Sheets

SEMICONDUCTOR DEVICE

BACKGROUND OF THE INVENTION

1. Field of the Invention

The present invention relates to a semiconductor device including two transistors on a semiconductor substrate of hexagonal crystal.

2. Background Art

When a plurality of mutually connected transistors are provided on a semiconductor substrate of hexagonal crystal such as SiC, the plurality of transistors are conventionally arranged so that extending directions of their gate electrodes are oriented toward the same direction. A technique is proposed which obtains desired characteristics by causing an extending direction of a gate electrode of one transistor to be oriented toward a specific crystal azimuth of a substrate (e.g., see FIGS. 1 and 2, and claims 2 and 3 of Japanese Patent Laid-Open No. 2004-327766). Furthermore, another technique is also proposed which arranges two transistors so that an angle formed between extending directions of their gate electrodes becomes 90 degrees and transistors of different characteristics coexist (e.g., see FIG. 3, claim 4, and paragraphs 0036 to 0038 of Specification of Japanese Patent Laid-Open No. 2004-327766).

SUMMARY OF THE INVENTION

When a plurality of transistors are arranged so that extending directions of their gate electrodes are oriented toward the same direction, if the number of fingers of the transistors and the number of transistor cells are increased, the lateral width of the entire device increases. Shortening gate intervals or cell intervals in accordance with limitations on the lateral width of the package may cause heat dissipation to deteriorate and lead to deterioration of characteristics.

Thus, arranging transistors so that extending directions of the gate electrodes are oriented toward mutually diagonal directions can shorten the lateral width of the chip. However, transistor characteristics vary depending on toward which azimuth of the hexagonal crystal substrate the extending direction of the gate electrode is oriented, which results in a problem that characteristics of the respective transistors differ from each other.

Japanese Patent Laid-Open No. 2004-327766 discloses that two transistors are arranged so that an angle formed between the extending directions of the gate electrodes becomes 90 degrees. However, this is intended to cause transistors of different characteristics to coexist. Therefore, the document does not recognize the problem of how characteristics of a plurality of mutually connected transistors are made uniform at all. Since source electrodes, drain electrodes and gate electrodes of the plurality of transistors are not connected to each other in the first place, there is no need to make characteristics of the plurality of transistors uniform.

In view of the above-described problems, an object of the present invention is to provide a semiconductor device which can make the characteristics of the transistors uniform and reduce the lateral width of the entire device without deteriorating heat dissipation performance.

According to the present invention, a semiconductor device includes: a semiconductor substrate of a hexagonal crystal; and a plurality of transistors on a c plane of the semiconductor substrate. Source electrodes of the plurality of transistors are connected to each other. Drain electrodes of the plurality of transistors are connected to each other. Gate electrodes of the plurality of transistors are connected to each other. An angle between extending directions of the gate electrodes of the plurality of transistors is 60 degrees or 120 degrees in a plan view seen from a direction perpendicular to the c plane of the semiconductor substrate.

The present invention makes it possible to make the characteristics of the transistors uniform and reduce the lateral width of the entire device without deteriorating heat dissipation performance.

Other and further objects, features and advantages of the invention will appear more fully from the following description.

DETAILED DESCRIPTION OF THE PREFERRED EMBODIMENTS

A semiconductor device according to the embodiments of the present invention will be described with reference to the drawings. The same components will be denoted by the same symbols, and the repeated description thereof may be omitted.

First Embodiment

Figure 1:
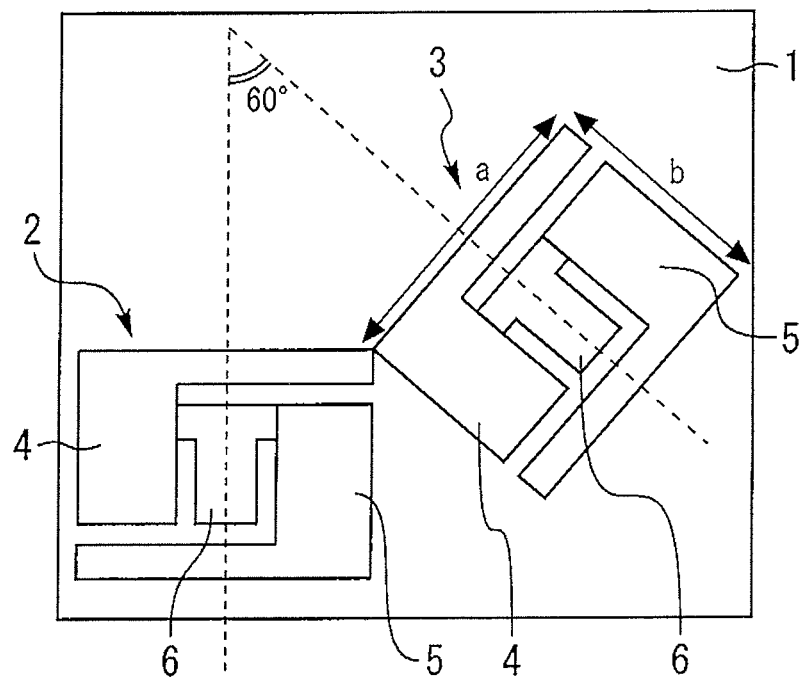
FIG. 1 is a plan view illustrating a semiconductor device according to a first embodiment of the present invention.

FIG. 1 is a plan view illustrating a semiconductor device according to a first embodiment of the present invention. A semiconductor substrate 1 is made of a hexagonal crystal such as 4H—SiC, 6H—SiC, GaN, sapphire, ZnO, AlN or BeO. Transistors 2 and 3 are provided on a c plane of this semiconductor substrate 1.

The transistors 2 and 3 each include a source electrode 4, a drain electrode 5 and a gate electrode 6 interposed therebetween. The source electrodes 4, drain electrodes 5, and gate electrodes 6 of the transistors 2 and 3 are connected to each other respectively.

In a plan view, seen from a direction perpendicular to the c plane of the semiconductor substrate 1, an angle formed between the extending directions of the gate electrodes 6 of the transistors 2 and 3 is 60 degrees. Since the hexagonal crystal semiconductor substrate 1 has a 60 degree rotational symmetry on the c plane, the characteristics of the transistors 2 and 3 can be made uniform. Furthermore, since the transistors 2 and 3 are arranged so that the extending directions of the gate electrodes 6 are diagonally oriented, it is possible to reduce the lateral width of the entire device without deteriorating heat dissipation performance.

Here, suppose the lateral width and longitudinal width of the transistors 2 and 3 are a and b respectively. The lateral width of the entire device can be reduced when the transistors 2 and 3 are arranged diagonally to each other (60 degrees) compared to when they are arranged side by side because the following relationship holds true.

$$a > \sqrt{3}b \qquad \text{[Expression 1]}$$

Figure 2:
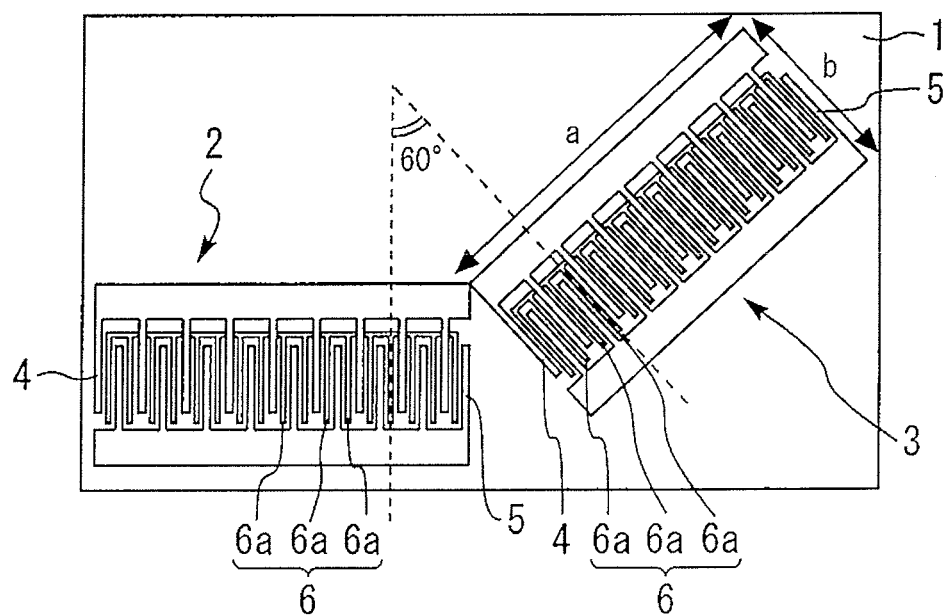
FIG. 2 is a plan view illustrating a modification example of the semiconductor device according to the first embodiment of the present invention.

FIG. 2 is a plan view illustrating a modification example of the semiconductor device according to the first embodiment of the present invention. In this modification example, the transistors 2 and 3 are transistor cells where each gate electrode 6 has a plurality of gate fingers 6a. The angle formed between the extending directions of the gate fingers 6a of both transistors 2 and 3 is 60 degrees. Since the transistor cell in FIG. 2 has a width a longer than that of the transistor in FIG. 1, a configuration with the reduced lateral width of the entire device is particularly effective.

Second Embodiment

Figure 3:
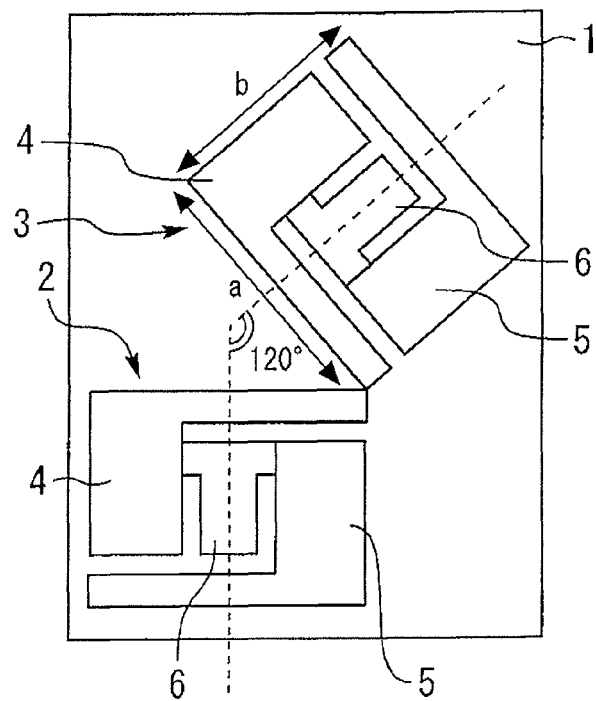
FIG. 3 is a plan view illustrating a semiconductor device according to a second embodiment of the present invention.

FIG. 3 is a plan view illustrating a semiconductor device according to a second embodiment of the present invention. In a plan view seen from a direction perpendicular to a c plane of a semiconductor substrate 1, an angle formed between extending directions of gate electrodes 6 of transistors 2 and 3 is 120 degrees. Since the hexagonal crystal semiconductor substrate 1 has a 60 degree rotational symmetry on the c plane, the characteristics of the transistors 2 and 3 can be made uniform. Furthermore, since the transistors 2 and 3 are arranged so that the extending directions of the gate electrodes 6 are diagonally oriented, it is possible to reduce the lateral width of the entire device without deteriorating heat dissipation performance.

Here, suppose the lateral width and longitudinal width of the transistors 2 and 3 are a and b respectively. The lateral width of the entire device can be reduced when the transistors 2 and 3 are arranged diagonally to each other (120 degrees) compared to when they are arranged side by side because the following relationship holds true.

$$a > \frac{\sqrt{3}}{2} b \quad \text{[Expression 2]}$$

Figure 4:
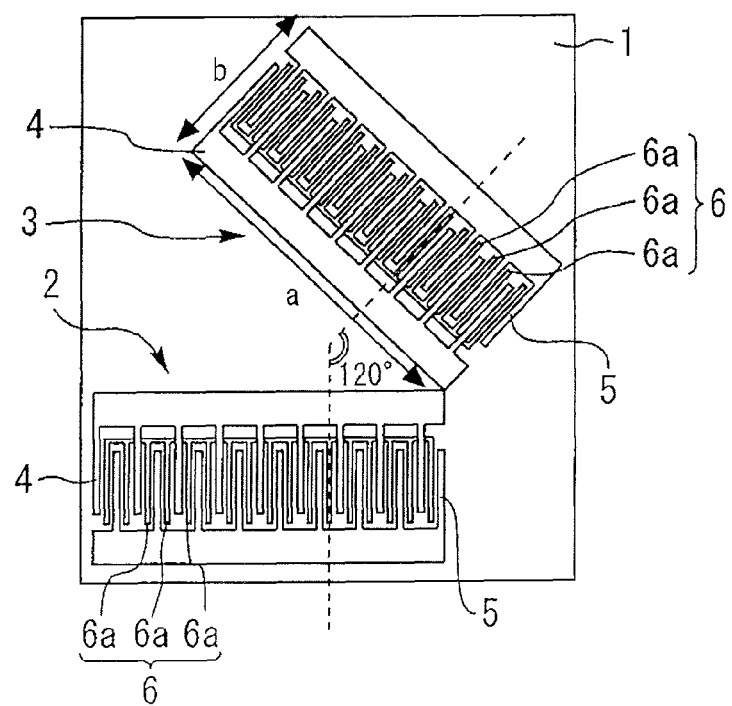
FIG. 4 is a plan view illustrating a modification example of the semiconductor device according to the second embodiment of the present invention.

FIG. 4 is a plan view illustrating a modification example of the semiconductor device according to the second embodiment of the present invention. In this modification example, the transistors 2 and 3 are transistor cells where each gate electrode 6 has a plurality of gate fingers 6a. The angle formed between the extending directions of the gate fingers 6a of both transistors 2 and 3 is 120 degrees. Since the transistor cell in FIG. 4 has a width a longer than that of the transistor in FIG. 3, a configuration with the reduced lateral width of the entire device is particularly effective.

In the semiconductor devices of the first and second embodiments, the angle formed between the gate electrodes 6 of the transistors 2 and 3 need only to be 60 degrees or 120 degrees and the direction of the gate electrode 6 need not match the azimuth of a specific crystal axis of the hexagonal crystal semiconductor substrate 1.

Although a case has been described in the first and second embodiments where there are two transistors 2 and 3, the number of transistors is not limited to two, but the present invention is also applicable to a case where three or more transistors are provided on the c plane of the hexagonal crystal semiconductor substrate 1.

Furthermore, the semiconductor devices according to the first and second embodiments using the semiconductor substrate 1 of hexagonal crystal such as SiC have a high withstand voltage and a high maximum allowable current density, and can thereby be reduced in size. Using such a small-sized device also allows a semiconductor module incorporating this device to be reduced in size. Furthermore, the device has high heat resistance, making it possible to reduce the size of its heat sink radiator fin and replace a water cooling system by an air cooling system, and thereby further reduce the size of the semiconductor module. Furthermore, the device has low power loss and provides high efficiency, and can thereby realize a highly efficient semiconductor module.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-150414, filed on Jul. 4, 2012, including specification, claims, drawings, and summary, on which the Convention priority of the present application is based, is incorporated herein by reference in its entirety.

What is claimed is:

1. A semiconductor device comprising:
a semiconductor substrate of a material having a hexagonal crystalline structure with a c-axis and c-planes; and
a plurality of transistors on a c-plane of the semiconductor substrate, wherein
source electrodes of the plurality of transistors are connected to each other,
drain electrodes of the plurality of transistors are connected to each other,
gate electrodes of the plurality of transistors are connected to each other, and
the gate electrodes of the plurality of transistors extend along directions that form angles with each other that are 60 degrees or 120 degrees, in a plan view seen from a direction perpendicular to the c-plane of the semiconductor substrate.

2. The semiconductor device according to claim 1, wherein the plurality of transistors are transistor cells,
each gate electrode has a plurality of gate fingers, and
the gate fingers of the plurality of transistors extend along directions that form angles with each other that are 60 degrees or 120 degrees in the plan view.

3. A semiconductor device comprising:
a single-crystal semiconductor substrate having a hexagonal crystalline structure with a c-axis and c-planes transverse to the c-axis; and
first and second field effect transistors on the semiconductor substrate, wherein
each of the first and second transistors has a source electrode, a drain electrode, and a gate electrode on a surface of the semiconductor substrate,
the surface of the semiconductor substrate lies in a c-plane,
the source electrodes of the first and second transistors are electrically connected to each other,
the drain electrodes of the first and second transistors are electrically connected to each other,
the gate electrodes of the first and second transistors are electrically connected to each other,
the gate electrodes of the first and second transistors extend along respective first and second straight lines on the surface of the semiconductor substrate, and
the first and second straight lines form an angle with each other that is 60 degrees or 120 degrees, in a view perpendicular to the surface of the semiconductor substrate.

4. The semiconductor device according to claim 3, wherein each of the first and second transistors is a transistor cell, each gate electrode has a plurality of gate fingers, and the gate fingers of each of the first and second transistors respectively extend along the first and second straight lines that form the angle.

* * * * *